US009583157B2

(12) United States Patent
Jeddeloh

(10) Patent No.: US 9,583,157 B2
(45) Date of Patent: *Feb. 28, 2017

(54) MEMORY DEVICE POWER MANAGERS AND METHODS

(71) Applicant: Micron Technology, Inc., Boise, ID (US)

(72) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/821,005

(22) Filed: Aug. 7, 2015

(65) Prior Publication Data

US 2015/0357010 A1  Dec. 10, 2015

Related U.S. Application Data

(63) Continuation of application No. 12/359,039, filed on Jan. 23, 2009, now Pat. No. 9,105,323.

(51) Int. Cl.
| G06F 1/26 | (2006.01) |
| G06F 1/32 | (2006.01) |
| G06F 13/00 | (2006.01) |
| G11C 7/10 | (2006.01) |
| G11C 5/14 | (2006.01) |
| G06F 13/40 | (2006.01) |
| G11C 5/02 | (2006.01) |

(52) U.S. Cl.
CPC .......... *G11C 7/1012* (2013.01); *G06F 1/3225* (2013.01); *G06F 1/3275* (2013.01); *G06F 13/4022* (2013.01); *G11C 5/02* (2013.01); *G11C 5/147* (2013.01); *G11C 5/148* (2013.01); *G11C 7/1072* (2013.01); *Y02B 60/1228* (2013.01)

(58) Field of Classification Search
CPC ....... G06F 1/3225; G06F 1/3275; G11C 5/02; G11C 5/147; Y02B 60/1228
See application file for complete search history.

(56) References Cited

U.S. PATENT DOCUMENTS

| 5,197,140 A | 3/1993 | Balmer |
| 5,396,635 A | 3/1995 | Fung |
| 5,524,248 A | 6/1996 | Parks et al. |
| 6,079,024 A | 6/2000 | Hadjimohammadi et al. |
| 6,125,429 A | 9/2000 | Goodwin et al. |
| 6,141,283 A | 10/2000 | Bogin et al. |

(Continued)

FOREIGN PATENT DOCUMENTS

| CN | 1665027 A | 9/2005 |
| CN | 1902709 A | 1/2007 |

(Continued)

OTHER PUBLICATIONS

"Chinese Application Serial No. 201080005310.2, Office Action mailed Jun. 24, 2014", 4 pgs.

(Continued)

*Primary Examiner* — Mark Connolly
(74) *Attorney, Agent, or Firm* — Schwegman Lundberg & Woessner, P.A.

(57) ABSTRACT

Memory devices and methods are described that include a stack of memory dies and an attached logic die. Method and devices described provide for power management of portions of a stack of memory dies. Additional devices, systems, and methods are disclosed.

20 Claims, 4 Drawing Sheets

(56) References Cited

U.S. PATENT DOCUMENTS

| | | | |
|---|---|---|---|
| 6,353,841 | B1 | 3/2002 | Marshall et al. |
| 6,442,698 | B2 | 8/2002 | Nizar |
| 6,618,791 | B1 | 9/2003 | Dodd et al. |
| 6,775,784 | B1 | 8/2004 | Park |
| 7,064,994 | B1 | 6/2006 | Wu |
| 7,089,436 | B2 | 8/2006 | Lee et al. |
| 7,216,197 | B2 | 5/2007 | Verdun et al. |
| 7,307,328 | B2 | 12/2007 | Meyer et al. |
| 7,307,338 | B1 | 12/2007 | Mandell et al. |
| 7,321,973 | B2 | 1/2008 | Choi et al. |
| 7,444,526 | B2 | 10/2008 | Felter et al. |
| 9,105,323 | B2 | 8/2015 | Jeddeloh |
| 2002/0091890 | A1 | 7/2002 | Farmwald et al. |
| 2003/0229821 | A1 | 12/2003 | Ma |
| 2004/0233772 | A1 | 11/2004 | Kudo |
| 2004/0260957 | A1 | 12/2004 | Jeddeloh et al. |
| 2005/0125701 | A1 | 6/2005 | Hensbergen et al. |
| 2005/0146919 | A1 | 7/2005 | Ellis et al. |
| 2005/0189639 | A1 | 9/2005 | Tanie et al. |
| 2006/0258354 | A1 | 11/2006 | Ul Haq |
| 2007/0011421 | A1 | 1/2007 | Keller, Jr. et al. |
| 2007/0070669 | A1 | 3/2007 | Tsern |
| 2008/0140912 | A1 | 6/2008 | Pandya |
| 2008/0256374 | A1 | 10/2008 | Harris et al. |
| 2008/0270811 | A1 | 10/2008 | Chow et al. |
| 2008/0307245 | A1 | 12/2008 | Cesare et al. |
| 2009/0070612 | A1 | 3/2009 | Adelman et al. |
| 2010/0191999 | A1 | 7/2010 | Jeddeloh |

FOREIGN PATENT DOCUMENTS

| | | | |
|---|---|---|---|
| CN | 101310338 | A | 11/2008 |
| CN | 102292715 | A | 12/2011 |
| CN | 104699226 | A | 6/2015 |
| JP | 11161778 | A | 6/1999 |
| JP | 2000222285 | A | 8/2000 |
| JP | 2001035146 | A | 2/2001 |
| JP | 2007517354 | A | 6/2007 |
| JP | 2008544437 | A | 12/2008 |
| KR | 101609311 | B1 | 3/2016 |
| TW | 201604887 | A | 2/2016 |
| WO | WO-9116680 | A1 | 10/1991 |
| WO | WO-2008063251 | A2 | 5/2008 |
| WO | WO-2008076790 | A2 | 6/2008 |
| WO | WO-2008063251 | A3 | 10/2008 |
| WO | WO-2010085657 | A2 | 7/2010 |
| WO | WO-2010085657 | A3 | 10/2010 |

OTHER PUBLICATIONS

"Chinese Application Serial No. 201080005310.2, Office Action mailed Aug. 13, 2013", 18 pgs.

"Chinese Application Serial No. 201080005310.2, Response filed Sep. 4, 2014 to Office Action mailed Jun. 24, 2014", 10 pgs.

"European Application Serial No. 10733911.1, Extended EP Search Report mailed Oct. 1, 2012", 7 pgs.

"European Application Serial No. 10733911.1 Response filed Feb. 6, 2015 to Examination Notification mailed Oct. 20, 2014", With the amended claims, 8 pgs.

"European Application Serial No. 10733911.1, Examination Notification Art. 94(3) mailed Oct. 20, 2014", 4 pgs.

"European Application Serial No. 10733911.1, Office Action Response filed Nov. 30, 2011", 3 pgs.

"International Application Serial No. PCT/US2010/021820, International Preliminary Report of Patentability mailed Aug. 4, 2011", 7 pgs.

"International Application Serial No. PCT/US2010/021820, Search Report mailed Aug. 27, 2010", 8 pgs.

"International Application Serial No. PCT/US2010/021820, Written Opinion mailed Aug. 27, 2010", 5 pgs.

"Japanese Application Serial No. 2011-548138, Office Action mailed Mar. 11, 2014", 8 pgs.

Endoh, T, et al., "New Three Dimensional (3D) Memory Array Architecture for Future Ultra High Density DRAM", Proc. 22nd International Conference on Microelectronics (MEIL 2000), vol. 2, (2000), 447-450.

"Chinese Application Serial No. 201080005310.2, Response filed Feb. 27, 2014 to Office Action mailed Aug. 13, 2013", W/ English Claims, 10 pgs.

"European Application Serial No. 10733911.1, Communication pursuant to Article 94(3) EPC mailed Jan. 27, 2016", 4 pgs.

"European Application Serial No. 10733911.1, Response filed Apr. 15, 2016 to Communication pursuant to Article 94(3) EPC mailed Jan. 27, 2016", 9 pgs.

"European Application Serial No. 10733911.1, Response filed Apr. 23, 2013 to Extended European Search Report mailed Oct. 1, 2012", 11 pgs.

"Japanese Application Serial No. 2011-548138, Response filed Jun. 10, 2014 to Office Action mailed Mar. 11, 2014", W/ English Claims, 18 pgs.

"Japanese Application Serial No. 2015-095403, Office Action mailed Jun. 7, 2016", W/ Machine Translation, 5 pgs.

"Japanese Application Serial No. 2015-095403, Response filed Aug. 1, 2016 to Office Action mailed Jun. 7, 2016", W/ English Claims, 7 pgs.

"Korean Application Serial No. 10-2011-7019440, Office Action mailed Jun. 25, 2015", W/ English Translation, 10 pgs.

"Korean Application Serial No. 10-2011-7019440, Response filed Aug. 25, 2015 to Office Action mailed Jun. 25, 2015", W/ English Claims, 15 pgs.

"Taiwanese Application Serial No. 099101838 Response filed Jun. 16, 2015 to Office Action mailed Mar. 26, 2015", With the English claims, 22 pgs.

"Taiwanese Application Serial No. 099101838, Office Action mailed Mar. 20, 2015", W/ English Translation, 12 pgs.

MEMORY DEVICE POWER MANAGERS AND METHODS

PRIORITY APPLICATION

This application is a continuation of U.S. application Ser. No. 12/359,039, filed Jan. 23, 2009, which is incorporated herein by reference in its entirety.

TECHNICAL FIELD

Various embodiments described herein relate to apparatus, systems, and methods associated with semiconductor memories.

BACKGROUND

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clock cycles waiting for responses to memory requests.

In addition, the evolution of software application and operating system technology has increased demand for higher-density memory subsystems as the number of processor cores and threads continues to increase. However, current-technology memory subsystems often represent a compromise between performance and density. Higher bandwidths may limit the number of memory cards or modules that may be connected in a system without exceeding Joint Electron Device Engineering Council (JEDEC) electrical specifications.

Extensions to JEDEC interface standards such as dual data rate (DDR) synchronous dynamic random access memory (SDRAM) have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

In the following detailed description of the invention, reference is made to the accompanying drawings that form a part hereof and in which is shown, by way of illustration, specific embodiments in which the invention may be practiced. These embodiments are described in sufficient detail to enable those skilled in the art to practice the invention. Other embodiments may be utilized and structural, logical, and electrical changes may be made.

Figure 1:
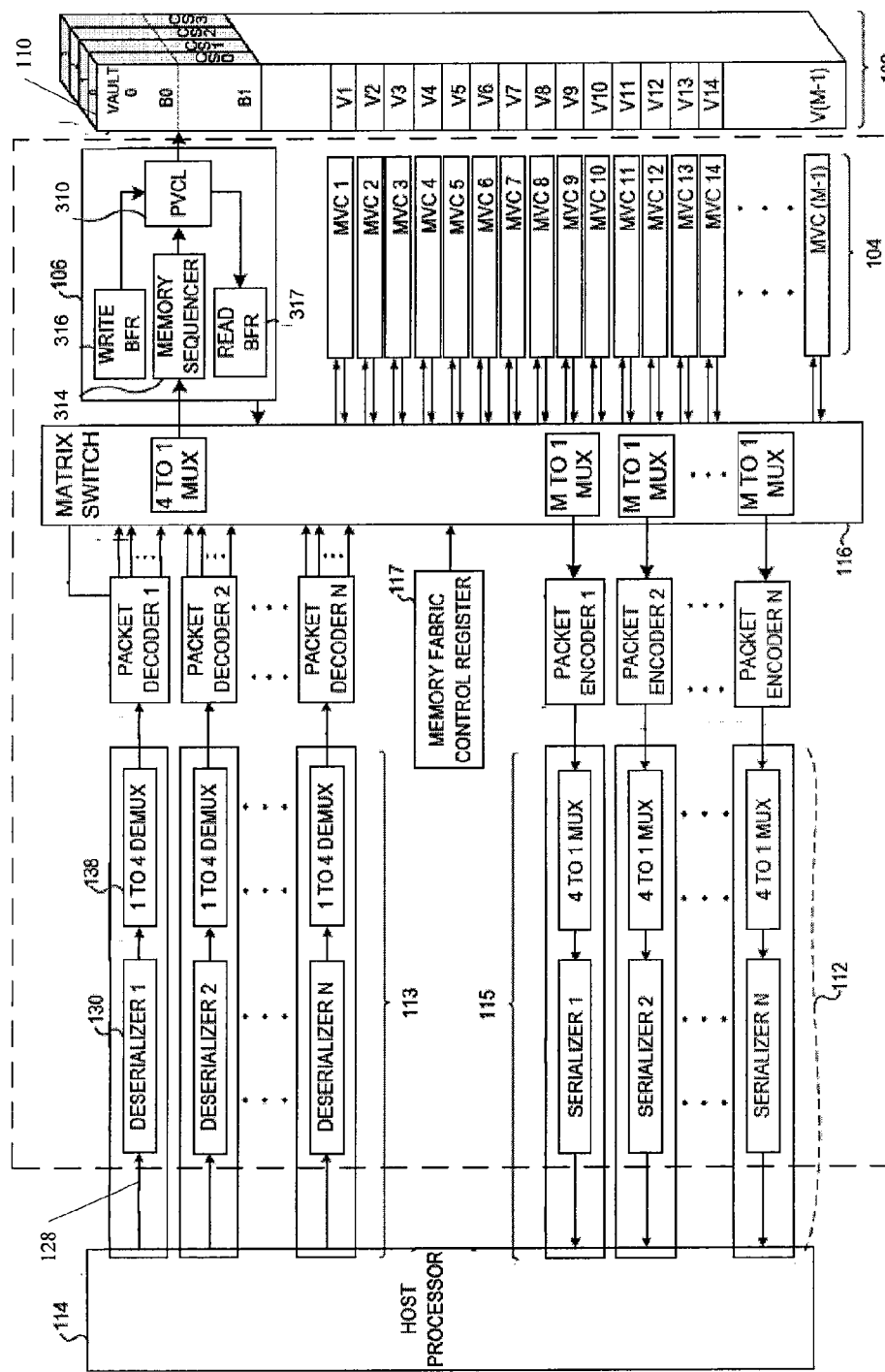
FIG. 1 shows a block diagram of a memory system according to an embodiment of the invention.

FIG. 1 includes a block diagram of a memory device 100 according to various example embodiments of the current invention. The memory device 100 operates to substantially concurrently transfer a plurality of outbound and/or inbound streams of commands, addresses, and/or data between one or more originating devices and/or destination devices (e.g., one or more processors) and a set of stacked-array memory "vaults" 110. Increased memory system density, bandwidth, parallelism, and scalability may result.

Multi-die memory array embodiments aggregate control logic that is normally located on each individual memory array die in previous designs. Subsections of a stacked group of dies, referred to in the present disclosure as memory vaults are shown as example vault 110 in FIG. 1 and as example vault 230 in FIG. 2. The memory vaults shown in the illustrated examples share common control logic. The memory vault architecture strategically partitions memory control logic to increase energy efficiency while providing a finer granularity of powered-on memory banks. Embodiments shown also enable a standardized host processor to memory system interface. The standardized interface may reduce re-design cycle times as memory technology evolves.

Figure 2:
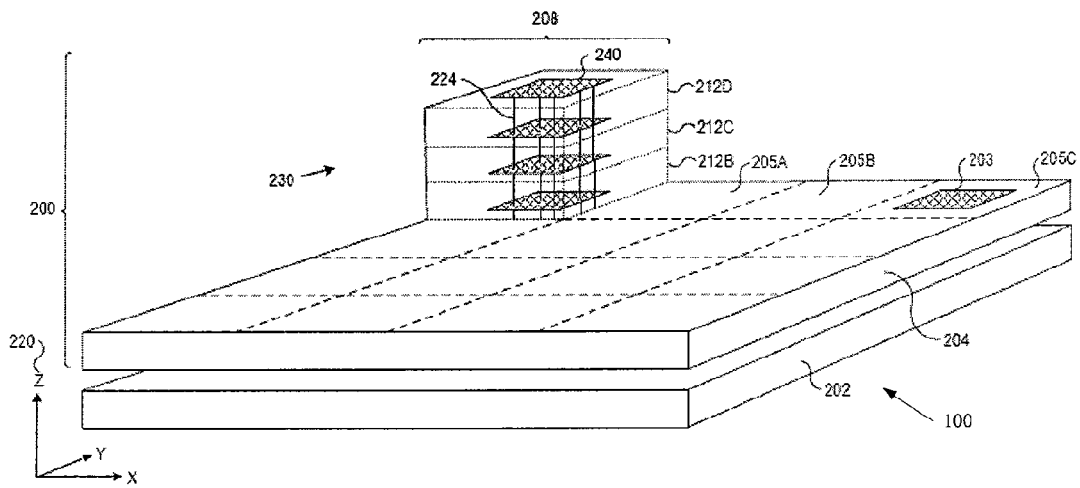
FIG. 2 shows a cut-away conceptual view of a stacked-die 3D memory with a logic die according to an embodiment of the invention.

FIG. 2 is a cut-away conceptual view of a stacked-die 3D memory array 200 stacked with a logic die 202 to form a memory device 100 according to various example embodiments. The memory device 100 incorporates one or more stacks of memory arrays 203 resulting in the stacked-die 3D memory array 200. Multiple memory arrays (e.g., the memory array 203) are fabricated onto each of a plurality of dies (e.g., the die 204). The memory array dies are then stacked to form the stacked-die 3D memory array 200.

Each die of the stack is divided into multiple "tiles" (e.g., the tiles 205A, 205B, and 205C associated with the stacked die 204). Each tile (e.g., the tile 205C) may include one or more memory arrays 203. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224) such as "through-wafer interconnects" (TWIs). It is noted that a TWI need not necessarily pass entirely through a particular wafer or die.

The stacked-die 3D memory array 200 in one configuration is partitioned into a set of memory "vaults" (e.g., the memory vault 230). Each memory vault includes a stacked set of tiles (e.g., the set of tiles 208), one tile from each of a plurality of stacked dies, together with a set of TWIs to electrically interconnect the set of tiles 208. Each tile of the vault includes one or more memory arrays (e.g., the memory array 240). Although partitions into individual vaults 230 are described, the 3D memory array 200 can be partitioned in a number of other ways also. Other example partitions include partitioning by dies, tiles, etc.

A set of memory vaults 102, similar to the memory vaults 230 from FIG. 2, is illustrated in FIG. 1 in context within the memory device 100. The memory device 100 also includes a plurality 104 of memory vault controllers (MVCs) (e.g., the MVC 106). Each MVC is communicatively coupled to a corresponding memory vault (e.g., the memory vault 110 of the set 102) in a one-to-one relationship. Each MVC is thus capable of communicating with a corresponding memory vault independently from communications between other MVCs and their respective memory vaults.

The memory device 100 also includes a plurality of configurable serialized communication link interfaces (SCLIs) 112. The SCLIs 112 are divided into an outbound group of SCLIs 113 and an inbound group of SCLIs 115, where "outbound" and "inbound" directions are defined from the perspective of the processor(s) 114. Each SCLI of the plurality of SCLIs 112 is capable of concurrent operation with the other SCLIs. Together the SCLIs 112 communicatively couple the plurality of MVCs 104 to one or more host processor(s) 114. The memory device 100 presents a multi-link, high-throughput interface to the host processor(s) 114.

The memory device 100 may also include a switch 116. In some embodiments, the switch 116 may comprise a matrix switch which might also be referred to as a cross connect switch. The switch 116 is communicatively coupled to the plurality of SCLIs 112 and to the plurality of MVCs 104. The switch 116 is capable of cross-connecting each SCLI to a selected MVC. The host processor(s) 114 may thus access the plurality of memory vaults 102 across the plurality of SCLIs 112 in a substantially simultaneous fashion. This architecture can provide high processor-to-memory bandwidth for modern processor technologies, including multi-core technologies.

The memory device 100 may also include a memory fabric control register 117 coupled to the switch 116. The memory fabric control register 117 accepts memory fabric configuration parameters from a configuration source and configures one or more components of the memory device 100 to operate according to a selectable mode. For example, the switch 116 and each of the plurality of memory vaults 102 and the plurality of MVCs 104 may normally be configured to operate independently of each other in response to separate memory requests. Such a configuration can enhance memory system bandwidth as a result of the parallelism between the SCLIs 112 and the memory vaults 102.

Alternatively, the memory device 100 may be reconfigured via the memory fabric control register 117 to cause a subset of two or more of the plurality of memory vaults 102 and a corresponding subset of MVCs to operate synchronously in response to a single request. The latter configuration may be used to access a data word that is wider than the width of a data word associated with a single vault. Such a word is herein referred to as a wide data word. This technique may decrease latency. Other configurations may be enabled by loading a selected bit pattern into the memory fabric control register 117.

In one example the outbound SCLIs 113 may include a plurality of outbound differential pair serial paths (DPSPs) 128. The DPSPs 128 are communicatively coupled to the host processor(s) 114 and may collectively transport an outbound packet. The outbound SCLI 113 may also include a deserializer 130 coupled to the plurality of outbound DPSPs 128. The outbound SCLI may also include a demultiplexer 138 communicatively coupled to the deserializer 130. In one embodiment, the configuration of DSPSs, deserializers, and demultiplexers facilitates efficient transfer of data packets or sub-packets. Similar to the outbound SLCIs, in one embodiment, the inbound SCLIs and a similar configuration of DSPSs, serializers, and multiplexers facilitate efficient transfer of data packets or sub-packets.

Figure 3:
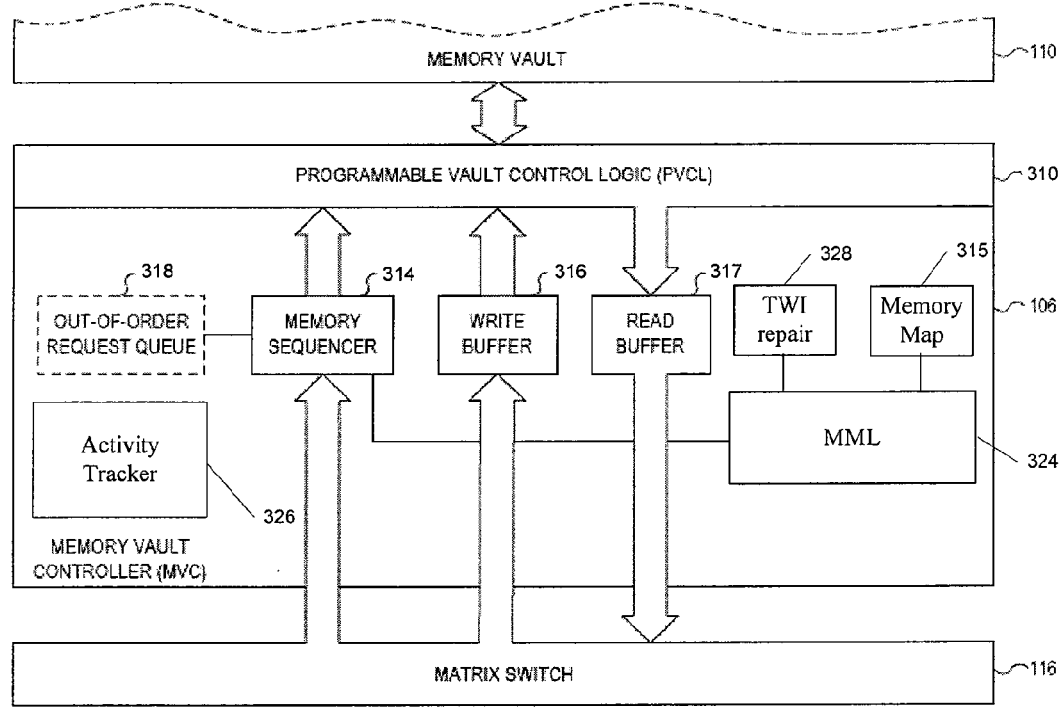
FIG. 3 shows a block diagram of a memory vault controller and associated modules according to an embodiment of the invention.

FIG. 3 is a block diagram of an MVC (e.g., the MVC 106) and associated modules according to various example embodiments. The MVC 106 may include a programmable vault control logic (PVCL) component 310. The PVCL 310 interfaces the MVC 106 to the corresponding memory vault (e.g., the memory vault 110). The PVCL 310 generates one or more control signals and/or timing signals associated with the corresponding memory vault 110.

The PVCL 310 may be configured to adapt the MVC 106 to a memory vault 110 of a selected configuration or a selected technology. Thus, for example, the memory device 100 may initially be configured using currently-available DDR2 DRAMs. The memory device 100 may subsequently be adapted to accommodate DDR3-based memory vault technology by reconfiguring the PVCL 310 to include DDR3 bank control and timing logic.

The MVC 106 includes a memory sequencer 314 communicatively coupled to the PVCL 310. The memory sequencer 314 performs a memory technology dependent set of operations based upon the technology used to implement the associated memory vault 110. The memory sequencer 314 may, for example, perform command decode operations, memory address multiplexing operations, memory address demultiplexing operations, memory refresh operations, memory vault training operations, and/or memory vault prefetch operations associated with the corresponding memory vault 110. In some embodiments, the memory sequencer 314 may comprise a DRAM sequencer. In some embodiments, memory refresh operations may originate in a separate refresh controller (not shown).

The memory sequencer 314 may be configured to adapt the memory device 100 to a memory vault 110 of a selected configuration or technology. For example, the memory sequencer 314 may be configured to operate synchronously with other memory sequencers associated with the memory device 100. Such a configuration may be used to deliver a wide data word from multiple memory vaults to a cache line (not shown) associated with the host processor(s) 114 in response to a single cache line request.

The MVC 106 may also include a write buffer 316. The write buffer 316 may be coupled to the PVCL 310 to buffer data arriving at the MVC 106 from the host processor(s) 114. The MVC 106 may further include a read buffer 317. The read buffer 317 may be coupled to the PVCL 310 to buffer data arriving at the MVC 106 from the corresponding memory vault 110.

The MVC 106 may also include an out-of-order request queue 318. The out-of-order request queue 318 establishes an ordered sequence of read and/or write operations to the plurality of memory banks included in the memory vault 110. The ordered sequence is chosen to avoid sequential operations to any single memory bank in order to reduce bank conflicts and to decrease read-to-write turnaround time.

The MVC 106 may also include a memory map logic (MML) component 324. The MML 324 manages a number of operations such as TWI repair operations using TWI repair logic 328, or other repair operations. In one example, the MML 324 tracks multiple error data for multiple portions of the 3D memory array 200. A number of different portions can be tracked using the MML 324. In one example, error data is tracked for each die 204. Other examples include tracking error data for each tile 205, each array 203, etc.

FIG. 3 shows an embodiment including a memory map 315. The memory map 315 interacts with the MML 324, keeps track of various memory portions of the 3D memory array 200, and stores characteristics such as error data that is specific to a particular tracked portion. Examples include tracking one or more characteristics for individual dies 204, vaults 230, tiles 205, or other groupings of a number of memory cells of the 3D memory array 200. Although error data is discussed as a characteristic that is tracked and used by the memory device 100, the invention is not so limited. Other characteristics specific to each memory portion are also tracked in various embodiments. Other characteristics may include, but are not limited to temperature, activity level, power down state, and refresh rate. Various characteristic data stored in the memory map 315 can be used in selected embodiments to manage different memory portions of the 3D memory array 200 individually.

In one embodiment, an activity tracker 326 is included to monitor individual levels of activity of multiple memory portions of the 3D memory array 200. Data from the activity tracker 326 is used in one example to change an individual power state of individual memory portions of the 3D memory array 200 such as vaults, dies, tiles, etc. By reducing a power state of portions not being used, or not being highly utilized, a power efficiency of the memory device 100 is increased.

In the example illustrated in FIG. 3, a number of activity trackers 326 are included, one for each MVC 106. In this configuration, each separate activity tracker 326 is used to track an associated vault 230. In some examples each activity tracker 326 is further used to track portions of each associated vault 230 such as individual tiles 212, etc. Although FIGS. 1-3 illustrate an embodiment with a plurality of activity trackers 326, other embodiments include different numbers of activity trackers such as a single activity tracker located on the logic chip 202. Having one activity tracker 326 in each MVC 106 facilitates easy monitoring and power regulation of the vault level of granularity.

Figure 4A:
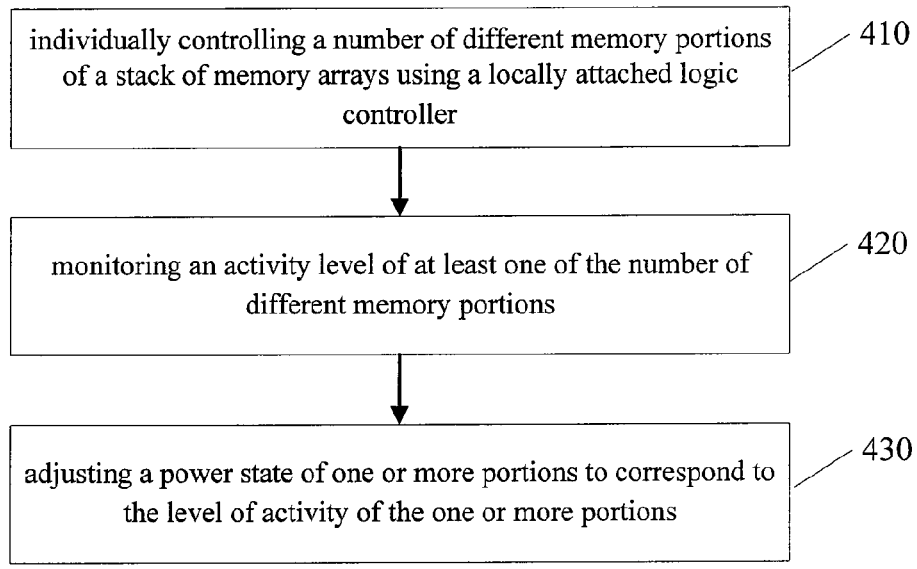
FIG. 4A shows a method of operating a memory device according to an embodiment of the invention.

FIG. 4A illustrates an example method of operation using an activity tracker such as tracker 326. In operation 410, individual memory portions are controlled within a stack of memory arrays using a locally attached logic controller such as the MVC 106 shown in FIGS. 1-3. As discussed above, examples of memory portions include vaults, dies, tiles etc.

Operation 420 recites monitoring an activity level of each of the number of different memory portions. In one example, an entire 3D memory array 200 is controlled and monitored, although the invention is not so limited. In other examples, only a portion of a 3D memory array 200 is monitored and operated to regulate power in just the monitored portion.

In operation 430, a power state of one or more of the portions is changed to correspond to the level of activity of each portion. In one example, a level of activity is tracked for a length of time, and compared to a threshold length of time. If the threshold is exceeded, then the power state of the portion is changed. One example of activity level includes monitoring complete inactivity. If a portion is inactive for a length of time exceeding the threshold, then the power state of the portion is changed. Monitoring and managing power levels using an activity tracker 326 or other local logic within the logic chip 202 allows the memory device 100 to provide power efficiency independent of the processor 114.

A number of levels of power states are possible using the discussed configurations. The simplest power levels include power to a memory portion such as a memory vault 230 being fully on, or fully off. In one embodiment, a number of intermediary power levels are also included. In one example, a portion such as a memory vault 230 is powered on, but without any refresh signals being sent to that portion. In one example, a refresh rate is increased or reduced depending on a level of activity of the memory portion. In one example, other support circuitry such as data links between the memory portion and the processor are powered down or up based on a level of activity of the memory portion. Data link examples include the SCLIs 112 shown in FIG. 1, and discussed above. In addition to the individual component examples listed above, combinations of components can be powered up or down in selected embodiments.

Figure 4B:
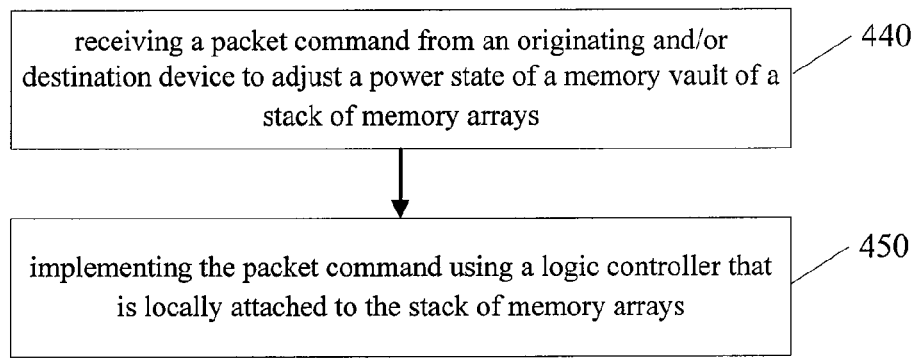
FIG. 4B shows another method of operating a memory device according to an embodiment of the invention.

Activity monitoring of memory portions and associated power level adjustment is described above using a locally attached activity tracker 326. In other embodiments, a local activity tracker 326 is not utilized, and power level adjustment is controlled from the processor or processors 114. FIG. 4B illustrates a method where in operation 440, a packet command is received from a host processor such as processor 114 to change a power state of a memory vault of a stack of memory arrays such as vault 230. In operation 450, the packet command is implemented using a logic controller that is locally attached to the stack of memory arrays.

One example of a locally attached logic controller includes MVC 106. In FIG. 3, for example, any of the above examples of power state options can be controlled by a packet command sent to the MVC 106. One specific example includes changing a refresh rate of a vault 230 upon receipt of a packet command to an MVC 106 as a result of changing activity within the vault 230. Another example of a packet command includes powering a selected MVC 106 on or off. Another example of a packet command includes powering a selected SCLI on or off.

Selected system embodiments include a memory device such as device 100, coupled to multiple processors such as a multi-core processor. In one embodiment, a portion of the memory device 100 is directly associated with a corresponding processor or processor core. In one example, if a processor or processor core is powered down, or set to a reduced power state, the corresponding portion of the memory device 100 is also powered down. For instance a vault 230 is powered down when an associated processor or processor core is powered down. Likewise when a processor or processor core is powered to a higher level, the associated vault or other memory portion is powered to a higher state.

In one example, an activity tracker such as tracker 326 from FIG. 3 monitors an associated processor or processor core, and local logic on logic die 202 powers the memory portion up or down. In another example a packet command is sent from the processor or processor core as it changes processor power state. The local logic on the logic die 202 then responds and changes a power state of the portion of the memory device accordingly.

The apparatus and systems of various embodiments may be useful in applications other than a high-density, multi-link, high-throughput semiconductor memory subsystem. Thus, various embodiments of the invention are not so limited. The illustrations of the memory device 100 are intended to provide a general understanding of the structure of various embodiments. They are not intended to serve as a complete description of all the elements and features of apparatus and systems that can use the structures described herein.

As discussed above, systems are described in the present disclosure that include 3D memory devices and processors. Examples of such systems, include, but are not limited to televisions, cellular telephones, personal data assistants (PDAs), personal computers (e.g., laptop computers, desktop computers, handheld computers, tablet computers, etc.), workstations, radios, video players, audio players (e.g., MP3

(Motion Picture Experts Group, Audio Layer 3) players), vehicles, medical devices (e.g., heart monitor, blood pressure monitor, etc.), set top boxes, and others.

Figure 5:
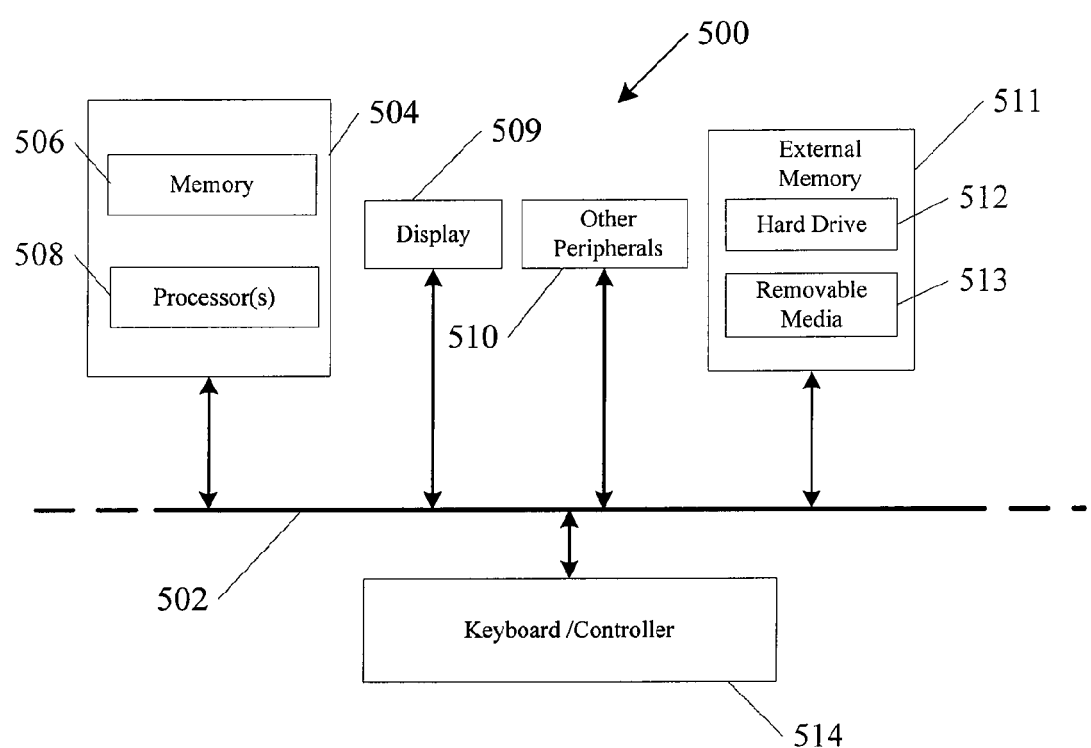
FIG. 5 shows a block diagram of an information handling system according to an embodiment of the invention.

A high level example of a personal computer is included in FIG. 5 to show one possible higher level device application for the present invention. FIG. 5 is a block diagram of an information handling system 500 incorporating at least one memory device 506 according to an embodiment of the invention.

In this example, information handling system 500 comprises a data processing system that includes a system bus 502 to couple the various components of the system. System bus 502 provides communications links among the various components of the information handling system 500 and may be implemented as a single bus, as a combination of busses, or in any other suitable manner.

Chip assembly 504 is coupled to the system bus 502. Chip assembly 504 may include any circuit or operably compatible combination of circuits. In one embodiment, chip assembly 504 includes a processor 508 or multiple processors that can be of any type. As used herein, "processor" means any type of computational circuit such as, but not limited to, a microprocessor, a microcontroller, a graphics processor, a digital signal processor (DSP), or any other type of processor or processing circuit. As used herein, "processor" includes multiple processors or multiple processor cores.

In one embodiment, a memory device 506 is included in the chip assembly 504. A memory device such as a DRAM is one example of such a memory device 506. One example of a DRAM device includes a stacked memory chip 3D memory device with an integrated logic chip as described in embodiments above. Memory 506 can also include non-volatile memory such as flash memory.

Information handling system 500 may also include an external memory 511, which in turn can include one or more memory elements suitable to the particular application, such as one or more hard drives 512, and/or one or more drives that handle removable media 513 such as flash memory drives, compact disks (CDs), digital video disks (DVDs), and the like.

Information handling system 500 may also include a display device 509 such as a monitor, additional peripheral components 510, such as speakers, etc. and a keyboard and/or controller 514, which can include a mouse, trackball, game controller, voice-recognition device, or any other device that permits a system user to input information into and receive information from the information handling system 500.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description.

What is claimed is:

1. A memory device, comprising:
   a stack of memory arrays;
   an activity tracker located in a die stacked with the stack of memory arrays to monitor different levels of activity of at least one of a plurality of portions of the stack of memory arrays, wherein the portions include a plurality of vertical memory vaults;
   a plurality of serialized communication link interfaces to couple the plurality of vertical memory vaults to a host processor; and
   a matrix switch enabling cross-connecting each of the plurality of serialized communication link interfaces to a selected vertical memory vault.

2. The memory device of claim 1, further comprising:
   a logic controller on the die stacked with the stack of memory arrays.

3. The memory device of claim 2, wherein the activity tracker is located in the logic controller.

4. The memory device of claim 2, wherein the logic controller is configured to change a power state of one or more serialized communication link interfaces.

5. The memory device of claim 3, wherein the logic controller is configured to adjust a power state of the at least one portion to correspond to the level of activity of the at least one portion.

6. The memory device of claim 5, wherein a power state includes powering down only selected memory vault controllers and their associated memory vaults.

7. A memory device, comprising:
   a stack of memory dies;
   a logic die stacked with the stack of memory dies;
   an activity tracker located in the logic die to monitor levels of activity of at least one portion of the stack of memory dies, wherein the portions include a plurality of vertical memory vaults, and wherein each vertical memory vault is associated with a respective vault controller located on the logic die;
   a plurality of serialized communication link interfaces to couple the plurality of vertical memory vaults to a host processor; and
   a matrix switch enabling cross-connecting each of the plurality of serialized communication link interfaces to a selected vertical memory vault.

8. The memory device of claim 7, wherein the logic die is configured to change a power state of one or more serialized communication link interfaces coupled to the vault controllers.

9. The memory device of claim 7, wherein the logic die is configured to adjust a power state of the at least one portion to correspond to the level of activity of the at least one portion.

10. The memory device of claim 7, wherein the logic die is configured to change a power state of an individual vault controller.

11. The memory device of claim 7, wherein each vault controller includes an activity tracker.

12. A memory device, comprising:
    a stack of memory dies;
    a number of originating devices; and
    a logic die stacked with the stack of memory dies to interface between the stack of memory dies and the number of originating devices, wherein the logic die is configured to change a power state of a portion of the stack of memory dies including a plurality of vertical memory vaults to correspond to a power state of one of the number of originating devices;
    a plurality of serialized communication link interfaces to couple the plurality of vertical memory vaults to a host processor; and a matrix switch enabling cross-connecting each of the plurality of serialized communication link interfaces to a selected vertical memory vault.

13. The memory device of claim 12, wherein the number of originating devices comprise a number of processors.

14. The memory device of claim 13, wherein the number of processors comprise a number of processor cores of a multi-core processing device.

15. The memory device of claim 12, wherein the stack of memory dies includes a number of vertical memory vaults, and the logic die is configured to change a power state of one or more vertical memory vaults.

16. The memory device of claim 15, wherein the logic die is configured to receive a packet command from one or more of the originating devices to change the power state.

17. A method of operating a memory device, comprising:
    individually controlling a number of different memory portions of a stack of memory arrays respectively using a number of memory vault controllers;
    monitoring an activity level of a memory portion of the number of different memory portions including a plurality of vertical memory vaults, wherein a plurality of serialized communication link interfaces couple the plurality of vertical memory vaults to a host processor, and wherein a matrix switch enables cross-connecting each of the plurality of serialized communication link interfaces to a selected vertical memory vault; and
    adjusting a power state of the memory portion to correspond to the level of activity of the memory portion.

18. The method of claim 17, further comprising:
    comparing the activity level of the memory portion to a threshold length of time.

19. The method of claim 17, wherein individually controlling a number of different memory portions of a stack of memory arrays comprises controlling a number of different vertical memory vaults.

20. The method of claim 17, wherein adjusting a power state of the memory portion further comprises adjusting a power state of the memory portion corresponding to a power state of one or more associated processor cores.

\* \* \* \* \*